US006876191B2

(12) United States Patent
de Ridder et al.

(10) Patent No.: US 6,876,191 B2
(45) Date of Patent: Apr. 5, 2005

(54) APPARATUS FOR TREATING WAFERS, PROVIDED WITH A SENSOR BOX

(75) Inventors: Christianus Gerardus M. de Ridder, Hoogland (NL); Gert-Jan Snijders, Amersfoort (NL); Albert Hasper, Meppel (NL); Jan Zinger, Dwingelo (NL)

(73) Assignee: ASM International N.V., Bilthoven (NL)

( * ) Notice: Subject to any disclaimer, the term of this patent is extended or adjusted under 35 U.S.C. 154(b) by 0 days.

(21) Appl. No.: 10/373,645

(22) Filed: Feb. 24, 2003

(65) Prior Publication Data

US 2003/0178142 A1 Sep. 25, 2003

(30) Foreign Application Priority Data

Feb. 25, 2002  (NL) .............................................. 1020054

(51) Int. Cl.[7] ......................... G01R 31/02; G01R 31/26
(52) U.S. Cl. ..................................... 324/158.1; 324/758
(58) Field of Search ................................ 324/537, 753, 324/754, 758, 158.1; 118/712, 719; 414/800–815; 219/497; 439/78–85; 438/611, 618

(56) References Cited

U.S. PATENT DOCUMENTS

| 5,407,449 | A | * | 4/1995 | Zinger ....................... 29/25.01 |
| 5,719,495 | A | * | 2/1998 | Moslehi ................... 324/158.1 |
| 5,981,399 | A | | 11/1999 | Kawamura et al. ......... 438/715 |
| 6,420,864 | B1 | * | 7/2002 | Abraham et al. ........ 324/158.1 |
| 6,632,068 | B2 | * | 10/2003 | Zinger et al. ............... 414/800 |

FOREIGN PATENT DOCUMENTS

EP        0 827 194 A1    3/1998

OTHER PUBLICATIONS

"Analyses of a 200/300 mm vertical furnace with integrated metrology", T. Claasen–Vujcic et al., *Solid State Technology*, Apr. 2001.
Patent Abstracts of Japan (European Patent Office), Publication No. 2001284444, Publication Date: Oct. 12, 2001; Application Date: Mar. 30, 2000; Application No. 2000094285. Applicant: Sony Corp.; Inventor: Matsusako Yuji; Title: Wafer Cassette Test Device. (1 sheet) Abstract only.

* cited by examiner

*Primary Examiner*—Kamand Cuneo
*Assistant Examiner*—Paresh Patel
(74) *Attorney, Agent, or Firm*—Weingarten, Schurgin, Gagnebin & Lebovici LLP

(57) ABSTRACT

An apparatus for treating wafers, provided with at least one treatment chamber, the apparatus being provided with a feeding section in which wafers contained in a wafer storage box can be fed into the apparatus, the apparatus being provided with a wafer handling apparatus, by means of which wafers can be taken out of the wafer storage boxes so as to be treated in the treatment chamber, and the apparatus being provided with at least one sensor box arranged such that the wafer handling apparatus can feed a wafer into the sensor box through an opening provided for that purpose in the at least one sensor box, and the at least one sensor box being arranged to carry out measurements at a wafer, wherein the at least one sensor box is movably arranged and the apparatus is provided with a sensor box handling apparatus arranged to move the at least one sensor box from a storage position to a measuring position.

22 Claims, 11 Drawing Sheets

APPARATUS FOR TREATING WAFERS, PROVIDED WITH A SENSOR BOX

The present invention relates to an apparatus for treating wafers, provided with at least one treatment chamber, the apparatus being provided with a feeding section in which wafers contained in a wafer storage box or wafer cassette can be fed into the apparatus, the apparatus being provided with a wafer handling apparatus, by means of which wafers can be taken out of the wafer storage boxes or wafer cassettes so as to be treated in the treatment chamber, and the apparatus being provided with at least one measuring sensor box arranged such that the wafer handling apparatus can feed a wafer into the at least one measuring sensor box through an opening provided for that purpose in the at least one sensor box, and the at least one sensor box being arranged to carry out measurements at a wafer.

Such an apparatus is known from practice and is put into circulation inter alia by applicant. In the known apparatus a number of wafers is subjected in the at least one processing chamber to a treatment, such as e.g. application of a layer by means of a CVD process, subjecting a wafer to a heat treatment or such treatments generally forming part of a process for the manufacture of e.g. IC chips.

Up to now the wafers, after having undergone a treatment step in a processing chamber of the above-described apparatus, are often taken out of the apparatus and brought to a measuring apparatus arranged outside the apparatus so as to check whether the treatment process has achieved the desired effect on the wafers. If this is the case, the wafers can undergo a next treatment step. In particular when the next treatment step must be carried out in the relevant apparatus again, this off-line measuring method is very time-consuming. There is therefore a trend towards providing the apparatus with measuring sensors, so that measurements at the wafers can be conducted without requiring that they are first received in a wafer storage box or wafer cassette again and removed from the apparatus so as to be conveyed to an off-line measuring station. A description of such an integrated measuring apparatus is given in Solid State Technology of April 2001 in the article "Analyses of a 200/300 mm vertical furnace with integrated metrology". The article shows inter alia that with integrated measuring sensors a shorter cycle time can be obtained for the manufacture of wafers and that the "overall equipment effectiveness (o.e.e.)" of the wafer treatment apparatus can be improved. In off-line measurements it often takes more than half an hour to obtain the measuring results. If this time can be lessened, the cycle time can be decreased, and queue problems can be reduced. Moreover, go-no go decisions can be made more rapidly, which leads to a better efficiency of the wafer treatment apparatus. As regards the apparatus according to the invention, it should particularly obtain that the "foot print" of the apparatus as a result of the integrated measuring sensors is not increased or increased as less as possible and that the normal treatment capacity of the apparatus is not negatively affected for the normal treatment protocols. It is highly important that the foot print should not be increased or be increased as less as possible, because the apparatus is arranged in a so-called clean room in which the use of additional floor surface is very expensive.

It is therefore an object of the invention to improve an apparatus of the type described in the opening paragraph such that different measurements can be carried out therein, while the foot print of the apparatus should not be increased or be increased as less as possible. To that end, the apparatus is characterized in that the at least one sensor box is movably arranged and that the apparatus is provided with a sensor box handling apparatus arranged to move the at least one sensor box from a storage position to a measuring position.

With such an apparatus it is possible to subject wafers that have just undergone a treatment to a measurement in which the sensor box can be brought into a position in which it can be simply loaded with a wafer by the wafer handling apparatus. When the measurements need not be carried out, the movably arranged sensor box can be simply brought into a storage position. The movable sensor box offers the possibility to use this box in different apparatus. Moreover, a number of sensor boxes can be stored in the apparatus in a number of storage positions, so that different types of measurements can be carried out, according to the need of the moment. Because of the movability it is not necessary to arrange all the sensor boxes within reach of the wafer handling apparatus. Also eligible are other positions for the storage of the sensor boxes, such as e.g. in or near a storage system for the wafer storage boxes.

The movable sensor boxes therefore offer a factory comprising more different apparatus a greater flexibility, because not every apparatus needs to be equipped with all the measuring apparatus, while yet all the desired measurements remain available in principle for all apparatus.

According to a further elaboration of the invention it is very favorable if the apparatus is provided with at least one wafer storage box door opener, such as e.g. a wafer storage box door opener arranged to open a FOUP wafer storage box, the sensor box being provided with a door arranged to cooperate with the wafer storage box door opener. After all, such a wafer storage box door opener is often available to open the wafer storage boxes, so that a wafer handling apparatus can take the wafers out of a wafer storage box and can place them in a boat. For wafers having a diameter of 300 mm and above the FOUP (Front Opening Unified Pod) is used as standardized wafer storage box. The FOUP is a wafer storage box provided with a boat fixedly arranged therein to receive wafers and with a removable door that can be removed by a correspondingly standardized wafer storage box door opener without the intermediary of an operator. Since in modern treatment apparatus mostly two or more wafer storage box door openers are available, one of these openers can be temporarily used to position a sensor box against it, which sensor box is arranged to cooperate with a FOUP door opener. In this manner an already existing apparatus in which no integrated measuring sensors are available to check just treated wafers can still be provided with such measuring sensors. In fact, it is only necessary in the known apparatus to include a sensor box that can cooperate with the wafer storage box door opener. Only the control software of the apparatus needs to be adjusted so as to make the apparatus already known per se and put into circulation suitable for integrated measurements.

According to a further elaboration of the invention it is very favorable if the sensor box has such dimensions and the sensor box handling apparatus is provided with such an interface with the sensor box that this satisfies the standards for a FOUP wafer storage box and a FOUP wafer storage box handling apparatus, so that the sensor box handling apparatus can also be used to move wafer storage boxes.

In this manner wafer storage boxes can be simply moved by the already available sensor box handling apparatus in the apparatus and a separate wafer storage box handling apparatus need not be provided anymore. When the apparatus according to a further embodiment of the invention is also provided with a storage system for a number of wafer storage boxes, the sensor box being adapted for arrangement in the storage system, a sensor box can be conveyed with the sensor box handling apparatus, e.g. from the storage system for wafer storage boxes to a measuring position in which wafers can be placed in the relevant sensor box. Also, with the sensor box handling apparatus a wafer storage box can be conveyed e.g. from the storage system for wafer storage boxes to a position in which a wafer storage box door opener is provided and in which, after opening the door of the wafer storage box, the wafer handling apparatus can take wafers out of the wafer storage box.

According to an alternative further elaboration of the invention it is also possible to provide the apparatus with a fixed storage position in which a movable sensor box can be arranged when no measurements need to be carried out. The advantage of such a fixed storage position is that the sensor box can remain connected with the apparatus with a fixed wiring, because the path the sensor box traverses within the apparatus is always known, i.e. from the fixed storage position to a wafer storage box door opener.

If this fixed storage position is situated near a stated wafer storage box door opener and the required range of the sensor box handling apparatus is within the required range of a possible storage box handling apparatus, it is very simple to extend the range of the sensor box handling apparatus such that the sensor box handling apparatus can also carry out all the required movements of wafer storage boxes.

In another variant the sensor box can be conveyed from this fixed storage position to a wafer storage box door opener with a sensor box handling apparatus specifically provided for that purpose, while for conveying wafer storage boxes a wafer storage box handling apparatus is provided.

According to yet another elaboration of the invention the apparatus is provided with a second sensor box movably arranged between a storage position and a measuring position. Preferably, the wafer storage boxes are designed as standardized FOUP boxes and the wafer storage box door opener is designed as a FOUP door opener, both according to SEMI STANDARD E 47.1.

In the variant in which the sensor box is stored in the storage system of the wafer storage boxes, the sensor box can generally assume different positions in this storage system. In such a variant it is very advantageous if the movable sensor box is provided with a transmitter and a receiver for wirelessly transmitting and receiving signals, such as control signals and measuring data, and with an energy source, such as a battery or an accumulator, so that the sensor box is not connected with cables to the apparatus, but can freely move through the apparatus. For this purpose infrared signal techniques can be used, such as IRDA, or radio techniques, in particular of the world standard "Blue tooth", known to those skilled in the art. Such a wireless connection may also be obtained if the sensor box and the measuring position are provided with a plug and a contra plug contacting each other by placing the sensor box in the measuring position.

The apparatus is particularly very advantageous if provided with at least two processing chambers and at least two boats, so that one boat can be unloaded and loaded in an unloading and loading position, while the other boat undergoes a treatment in a processing chamber, the wafers of the boat that is in the unloading and loading position being movable to a stated sensor box with the wafer handling apparatus. Thus during the treatment of a first boat of wafers the wafers from a just treated boat of wafers can be subjected to a number of measurements in the sensor box. Such measurements may comprise e.g. the check on the applied layer thickness by means of an ellipsometer or the check on the number of particles in the applied layer by means of a particle counter. Furthermore, the sensor box may comprise a wafer notch aligner, so that the rotative position of the wafer can be determined, and the sensor box may contain a wafer ID reader.

Optionally, besides the movable sensor box the apparatus may further be provided with a fixedly arranged measuring station included in the apparatus in such a position that the wafer handling apparatus can place wafers in and can take them out of the fixed measuring station.

The invention also relates to a sensor box apparently intended for an apparatus according to one of the above-described elaborations. This sensor box preferably has an interface and dimensions making it suitable for cooperation with a door opener and a wafer storage box conveying and storage system arranged to cooperate with standardized FOUP wafer storage boxes.

The invention will now be explained on the basis of a number of exemplary embodiments, with reference to the drawings.

Figure 1:
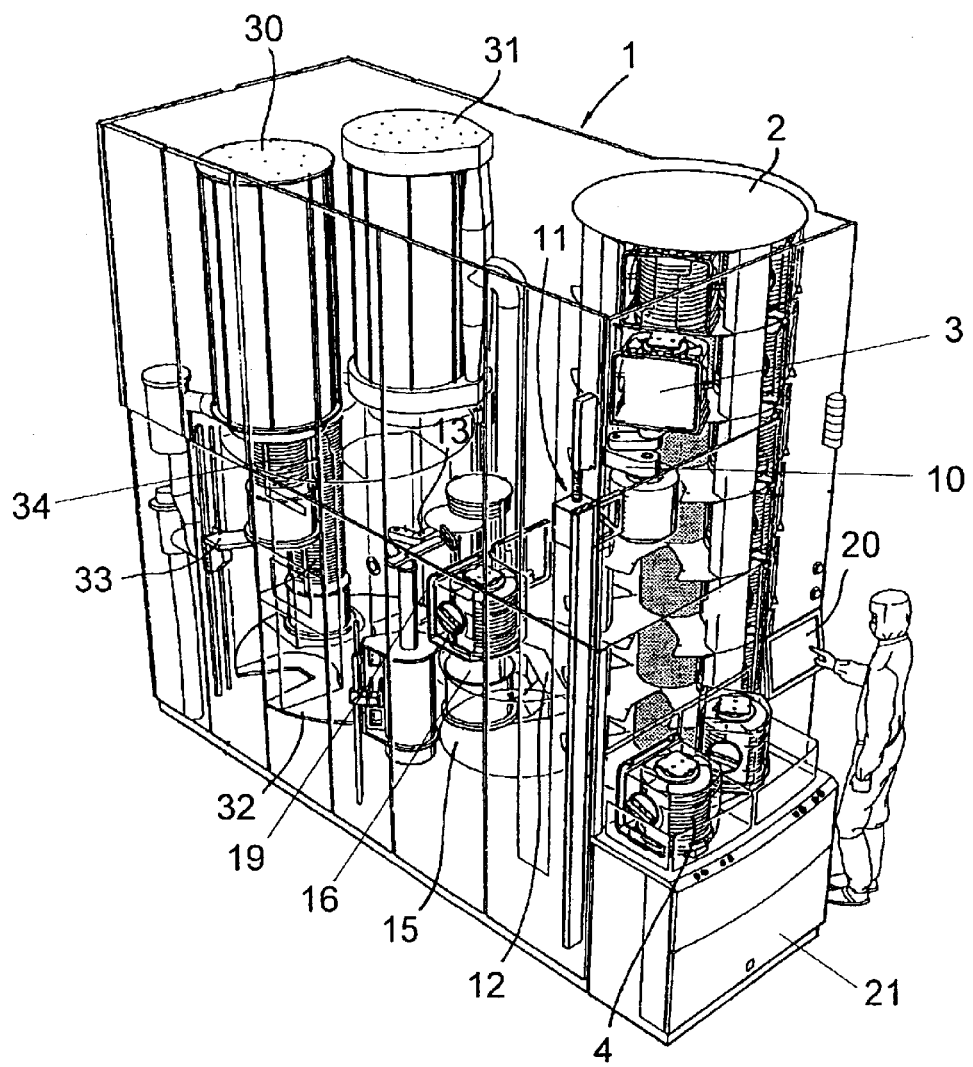
FIG. 1 is a perspective view of a first exemplary embodiment of the apparatus according to the invention.

FIG. 1 is a perspective view of an exemplary embodiment of an apparatus according to the invention for treating wafers. The apparatus 1 is provided with two processing chambers 30, 31, which can be loaded from a bottom side with a boat 34, into which a number of wafers are fed. The boats 34 are arranged on a boat carousel 32, by means of which the boats 34 can be brought from an unloading and/or loading position 35, which is clearly visible in FIG. 2, to a treatment position below the first treatment chamber 30 or the second treatment chamber 31. In both treatment chambers 30, 31 a lift 33 is provided, by means of which a boat of wafers can be lifted so as to bring this boat into a treatment chamber 30, 31. Furthermore, opposite the unloading and/or loading position 35 a cooling position 36 is available where a boat of wafers 34 situated on the carousel 32 can cool down after this has undergone a treatment in the treatment chamber 30, 31. The treatment chamber 30, 31 and the boat carousel 32 with the boat lifts 33 are located in a space 39 in the apparatus, which space is bounded by a partition 38. A second partition 43 bounds, together with the first partition 38, a wafer handling space 44. Arranged in this wafer handling space 44 is a wafer handling apparatus 13, by means of which wafers can be placed in a boat 34. The boat 34 can be brought to the loading and/or unloading position 35 by means of a boat handling apparatus 12 via a door in the first partition 38 and can be removed therefrom and placed in a wafer loading and/or unloading position 46. The second partition 43 contains a number of openings bounded by a so-called door opener 18, 19. In the present exemplary embodiment, door openers 18, 19 are available at two levels. With such a door opener 18, 19 a door of a wafer storage box, in the present art also called FOUP, can be opened and closed. For an accurate description reference is made to WO 99/38199, the contents of which are to be considered inserted herein by reference. The space located on the side of the second partition wall 43 facing away from the wafer handling space 44 is filled with inter alia a wafer storage box handling apparatus 10 and a wafer storage box storage system 2, into which a large number of wafer storage boxes 4 can be fed. Also available in the wafer storage box handling space 45 are two turn tables 15, 16, on which a wafer storage box 4 can be placed by the wafer storage box handling apparatus 10, and by means of which a wafer storage box 4 can be brought before a door opener 18, 19. The wafer storage box handling apparatus 10 is also positioned such that it can take a wafer storage box 4 from an input/output station 21 so as to place this either in the storage system 2 or on the turn table 15 or 16. Furthermore, an operating panel 20 is visible, by means of which an operator can operate the apparatus.

Figure 2:
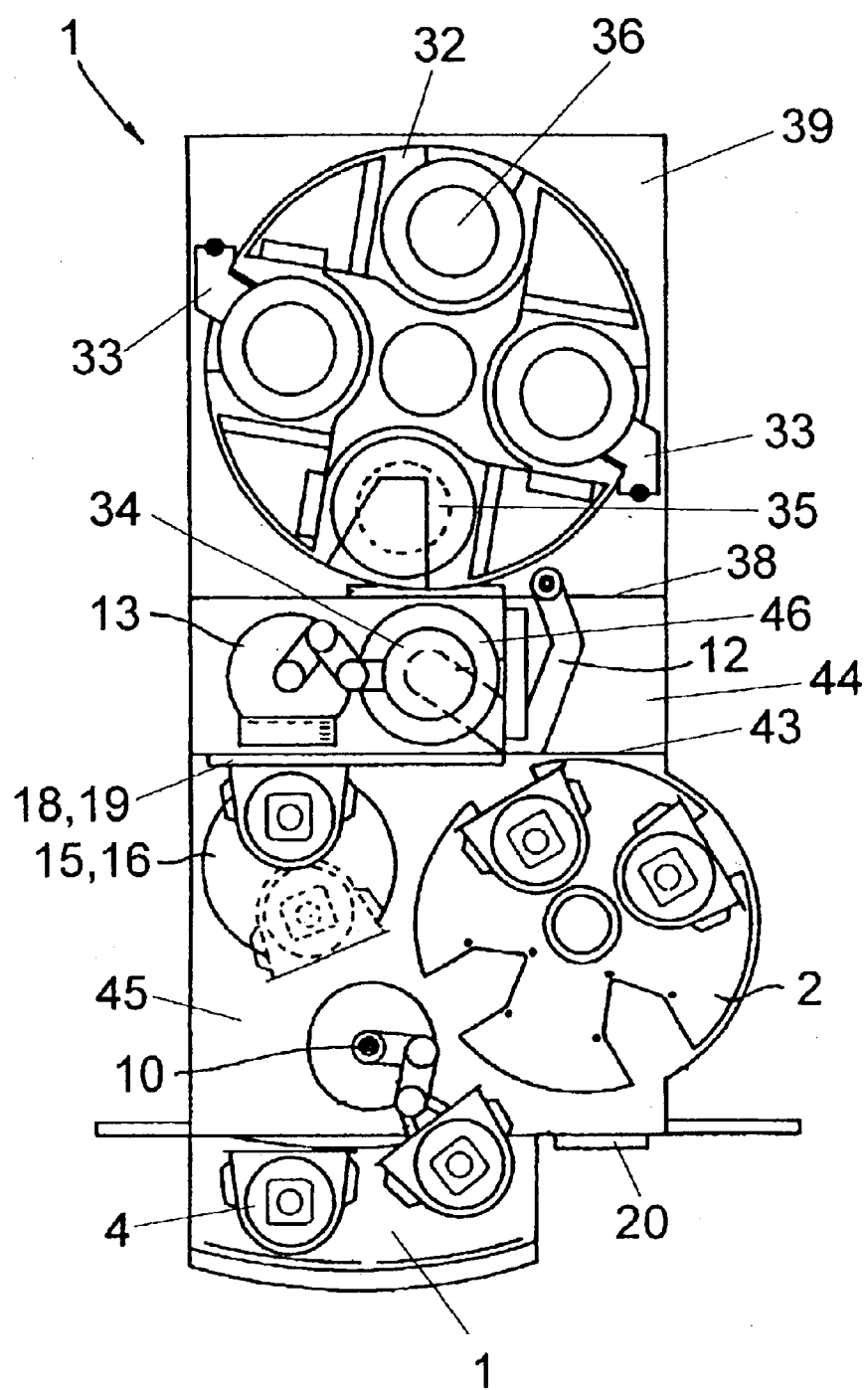
FIG. 2 is a top view of the first exemplary embodiment shown in FIG. 1.

In the exemplary embodiment of FIGS. 1 and 2 a movable sensor box 3 is included. In FIG. 1 this sensor box 3 is handled by the wafer storage box handling apparatus 10 near a top side of the storage system 2 for the wafer storage boxes 4. The sensor box 3 wirelessly connected with the apparatus is provided with an interface and dimensions making it suitable for cooperation with the wafer storage box handling apparatus and for placement of the sensor box in the wafer storage box storage system. Furthermore, the sensor box is provided with a door arranged to cooperate with the wafer storage box door openers 18, 19 of the apparatus. If measurements are to be carried out at wafers, the sensor box 3 is conveyed by the wafer storage box handling apparatus 10 and the lift 11 forming part thereof to a door opener 18, 19, and there the door of the sensor box is opened. Subsequently, with the wafer handling apparatus 13 wafers can be brought from a boat 34 with wafers situated in the wafer handling space 44 into the sensor box 3 so as to carry out one or more measurements at them. If the desired measurements have been conducted, the sensor box can be removed from the door opener 18, 19 again by means of the turn tables 15, 16 and the wafer storage box handling apparatus 10, 11 and be placed in the storage system 2. Because the sensor box 3 is not connected to the apparatus with cables, it is very simple to introduce a sensor box into the apparatus or to remove it from the apparatus via the input/output station 21 and the wafer storage box handling apparatus 10.

Figure 3:
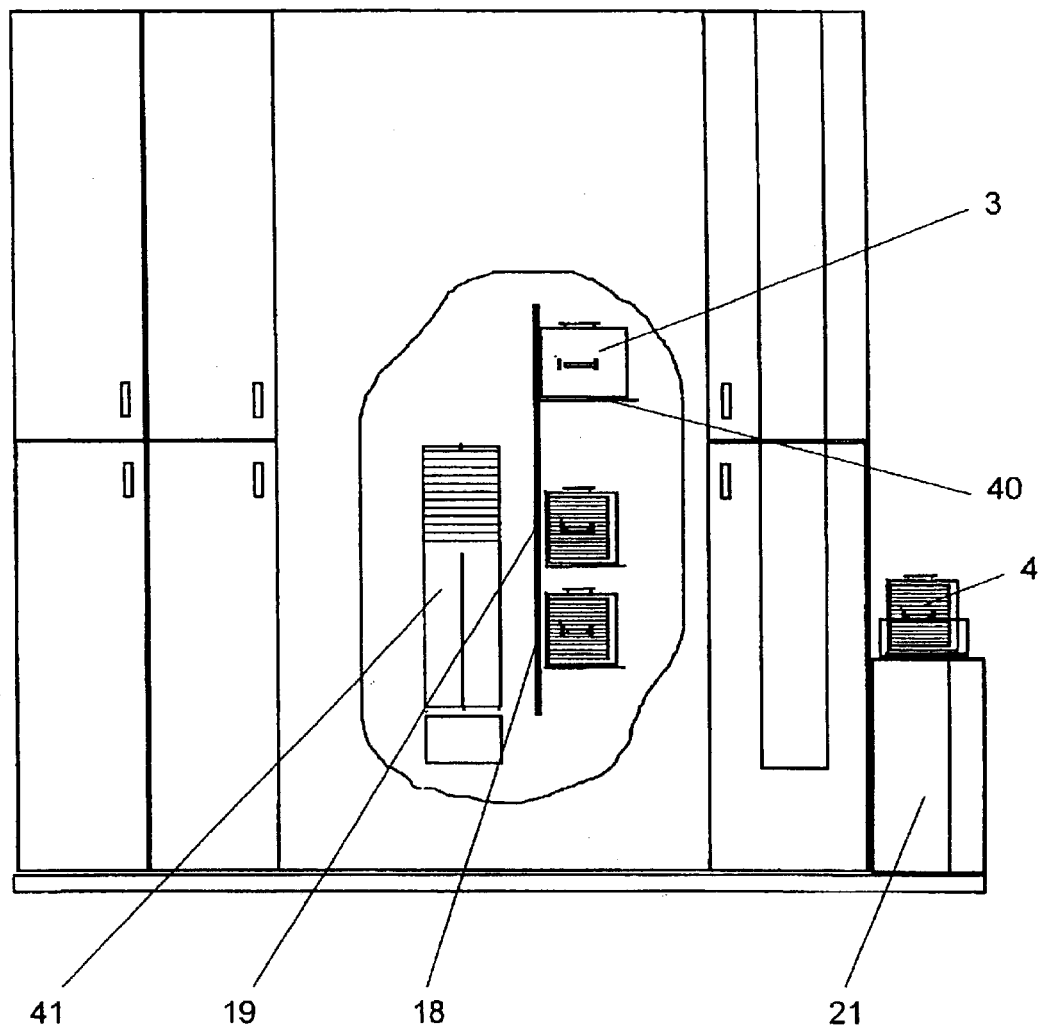
FIG. 3 is a side view of a second exemplary embodiment, in which a part of the side plating is removed, so that the sensor box is visible in a fixed storage position thereof.
Figure 4:
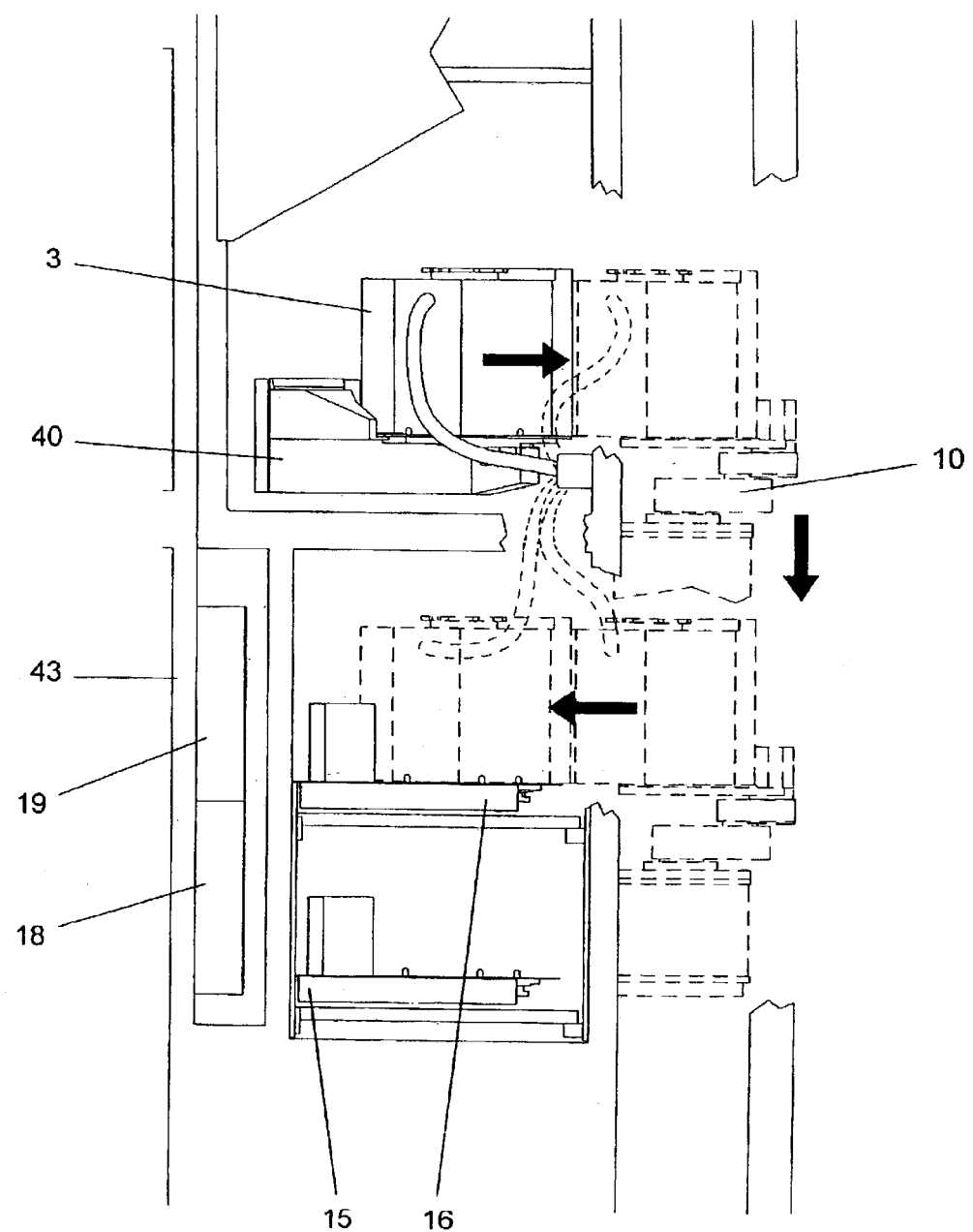
FIG. 4 is a side view of a part of the second exemplary embodiment, in which the fixed place of arrangement for the sensor box is clearly visible.
Figure 5:
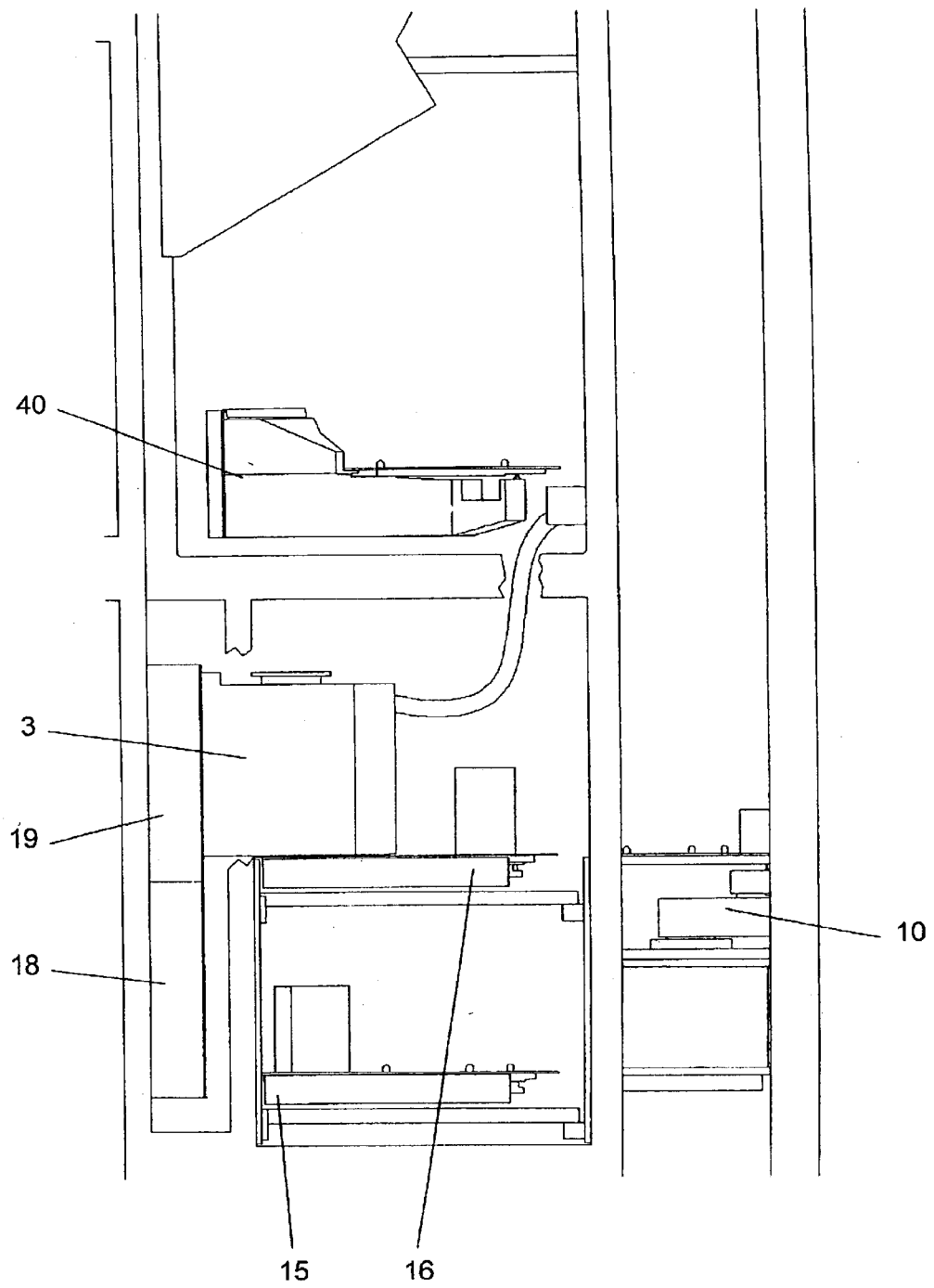
FIG. 5 is a similar view as shown in FIG. 3, in which the sensor box is connected with the wafer storage box door opener.
Figure 6:
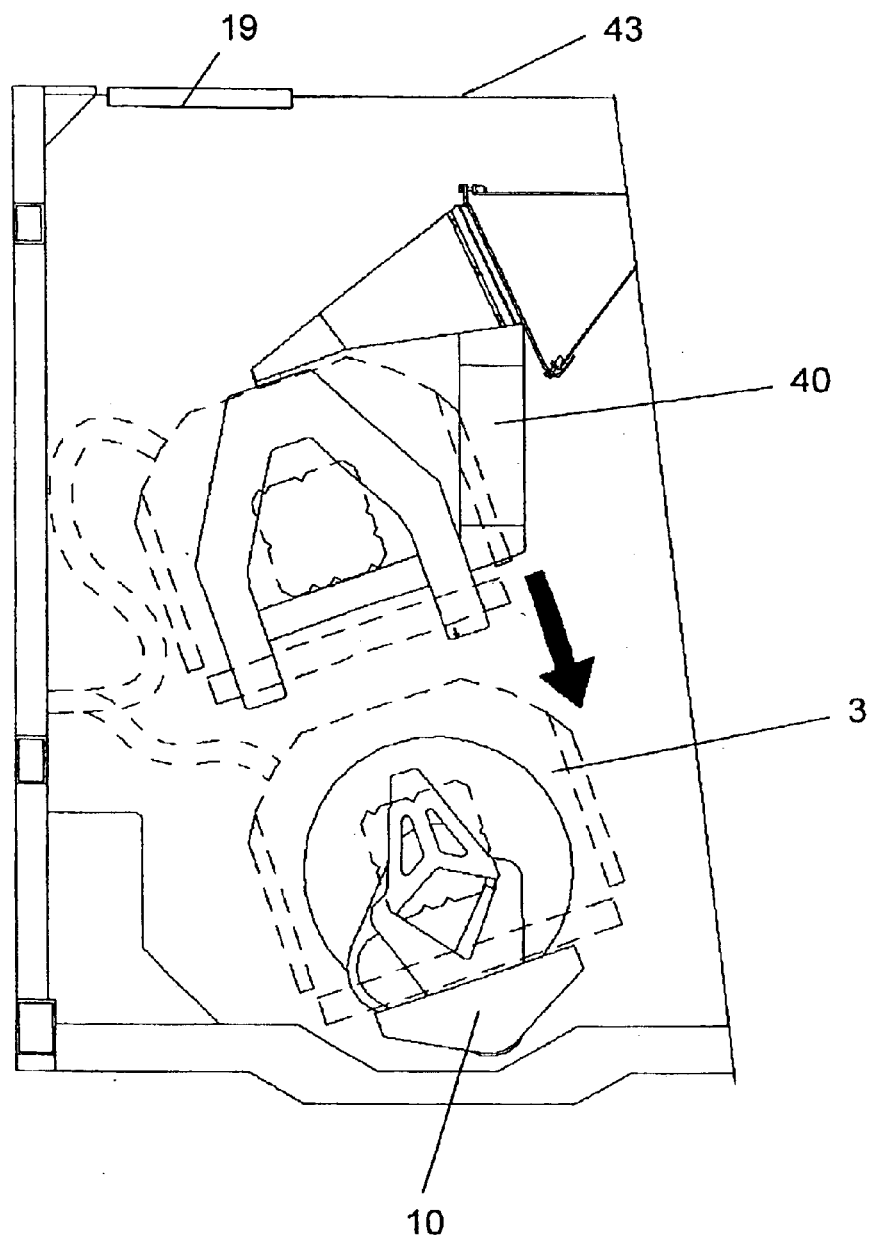
FIG. 6 is a top view of the part shown in FIGS. 3 and 4.

The second exemplary embodiment shown in FIGS. 3–6 differs from the first exemplary embodiment in that the sensor box is not stored in the already available storage system for the wafer storage boxes 4, but at its own fixed storage position 40 located above the door openers in the second partition wall 43. Through this position the storage position 40 does not occupy an extra foot print of the apparatus. It is clearly shown that the wafer storage box handling apparatus 10 can take the sensor box 3 from the storage position and place it on the above turn table 15, 16, so that the sensor box can be moved against a door opener 19. FIG. 3 shows the sensor box in full lines in the storage position and in dash lines in a number of intermediate positions. FIG. 5 shows the sensor box in the position in which the door opener 19 can open the door of the sensor box 3. FIG. 6 is a top view of the relevant part of the second exemplary embodiment, in which the trend of movement of the sensor box 3 from the storage position 40 to an intermediate position is indicated by means of the black arrow P.

Figure 7:
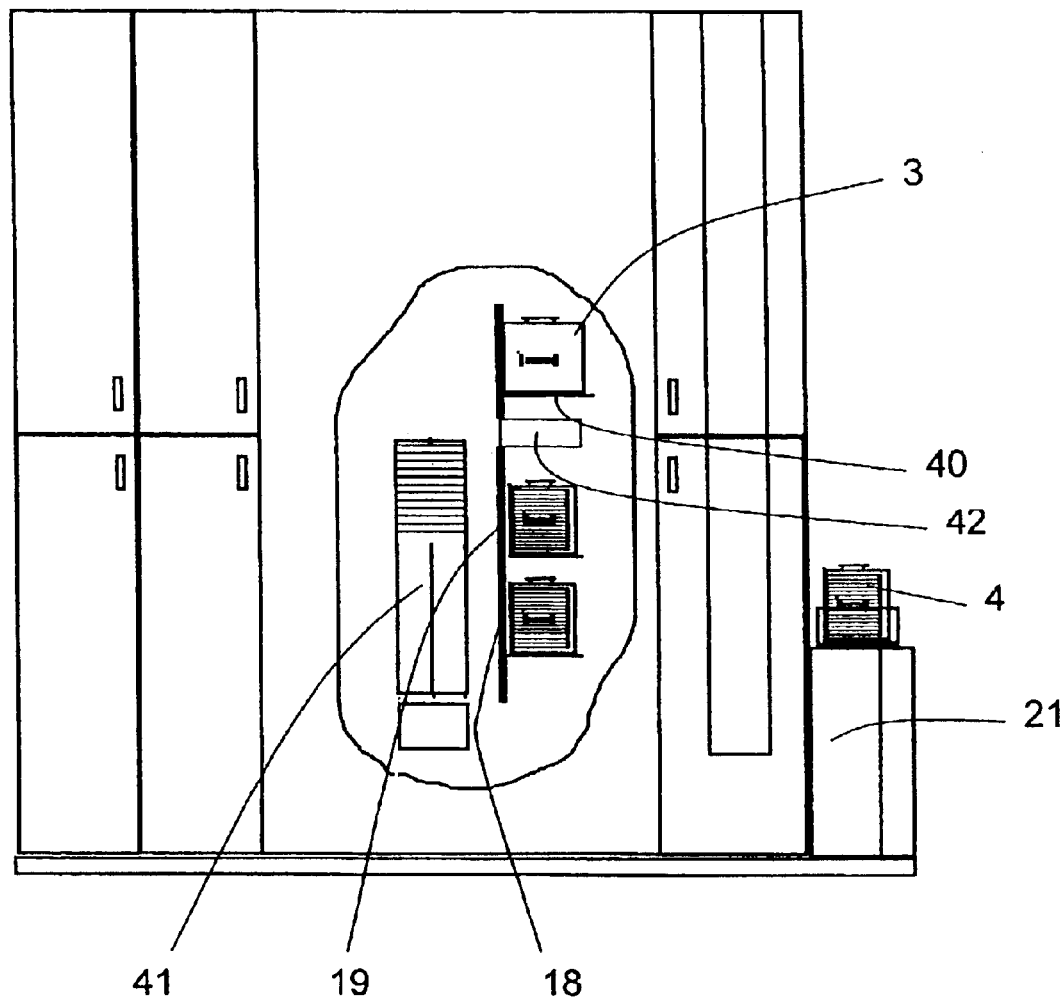
FIG. 7 is a similar side view as shown in FIG. 3, in which a fixedly arranged sensor box is provided below the movably arranged sensor box.

FIG. 7 shows a third exemplary embodiment, in which the sensor box 3 has a fixed storage position 40 above the door openers 18, 19. Located between these storage positions and the door openers is a fixed measuring station 42, in which wafers can be placed by means of the wafer handling apparatus 13 so as to carry out measurements at them. The third exemplary embodiment therefore combines a fixedly integrated measuring station with a movable sensor box 3.

Figure 8:
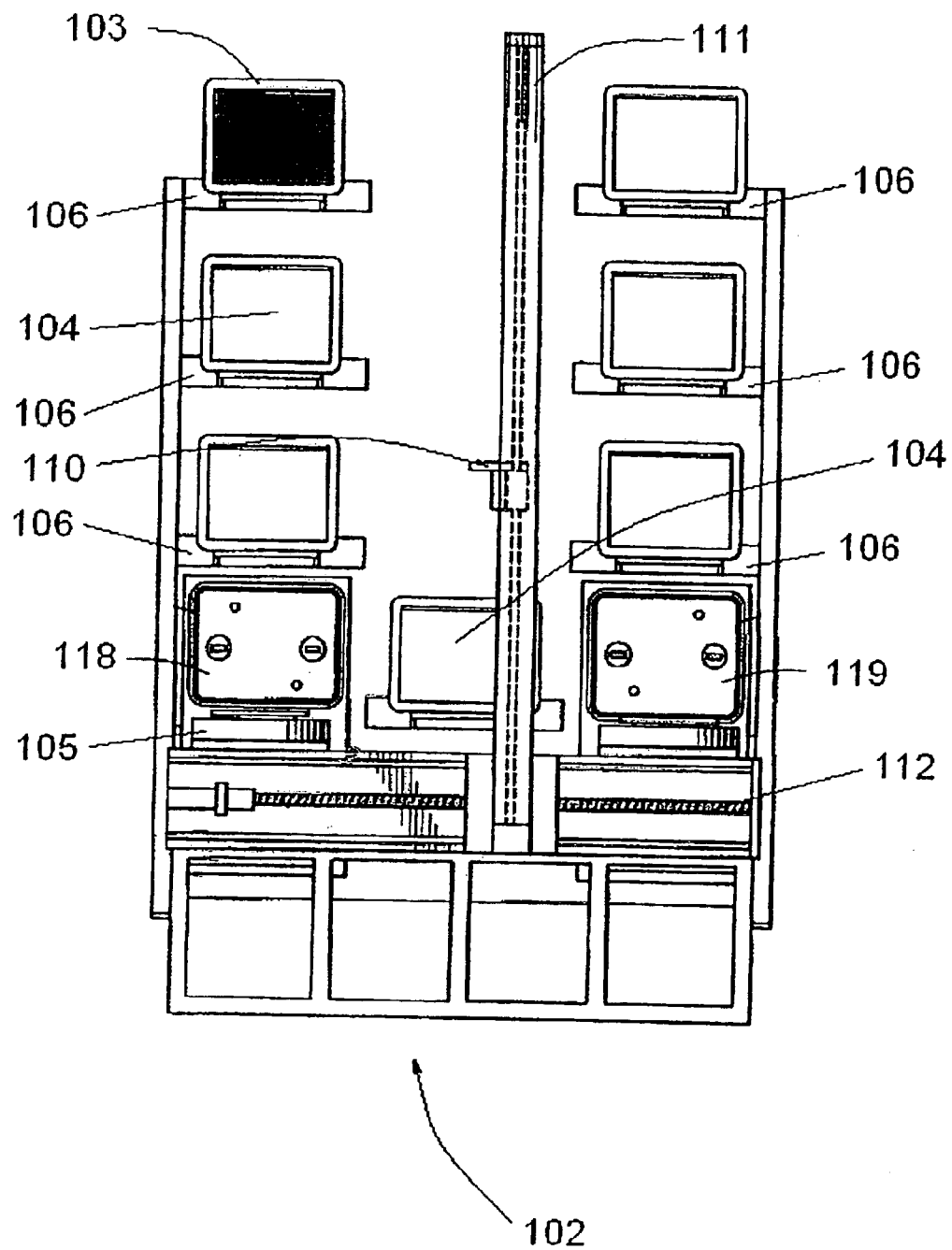
FIG. 8 is a front view of a storage system for wafer storage boxes.
Figure 9:
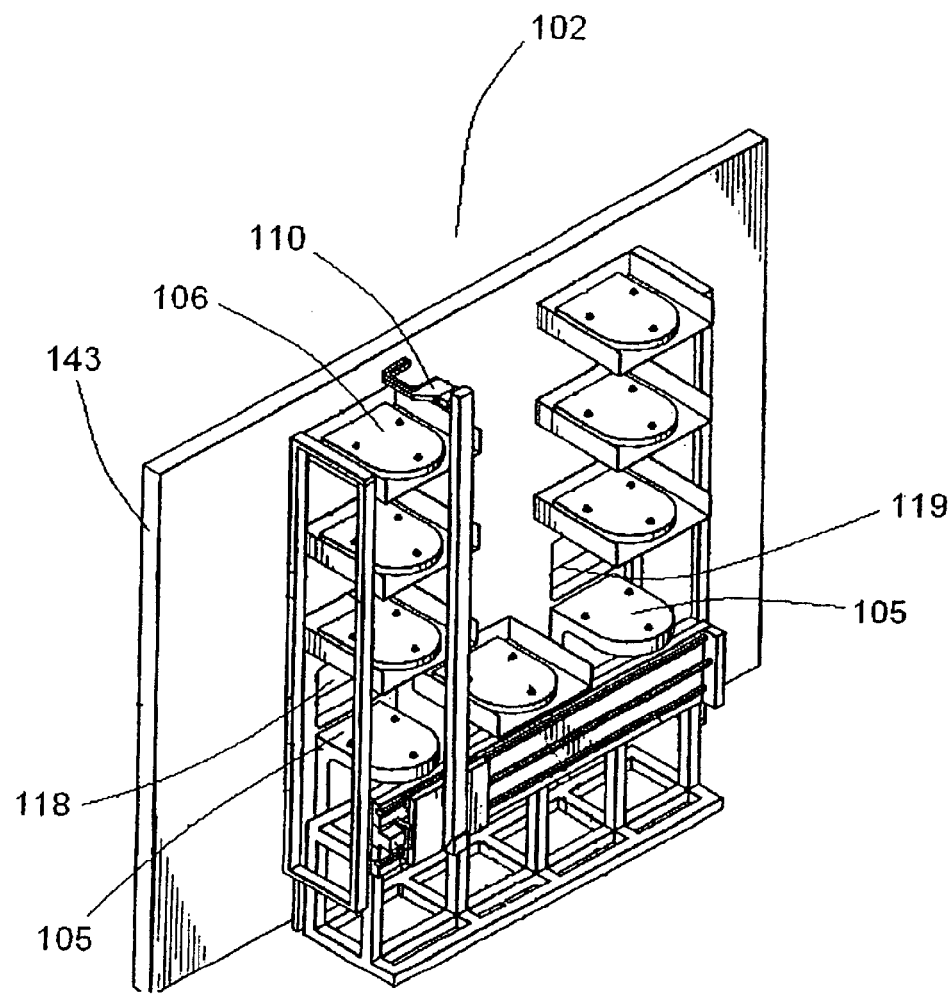
FIG. 9 is a perspective view of the storage system shown in FIG. 8.

FIGS. 8 and 9 show an alternative wafer storage box handling system, in which a wafer storage box handling apparatus 110 is provided with a vertical lift 111 movable in the horizontal direction by means of a horizontal spindle 112. Furthermore, a number of wafer storage box shelves 106 are provided, on which the wafer storage boxes 104 can be placed. In the wall 143 two door openers 118, 119 are provided, by means of which a door of a wafer storage box 104 can be opened. On the shelf 106 shown at the left top side of FIG. 8 a sensor box 103 is shown, which can be conveyed to a door opener by means of the wafer storage box handling apparatus 110. It may be clear that the exemplary embodiment of FIGS. 8 and 9 forms an alternative to the wafer storage box handling apparatus with carousel storage shown in FIGS. 1 and 2. Also, the apparatus for treating wafers, located behind the wall 143, may be of another design than in the example of FIGS. 1 and 2. Thus this apparatus may be designed for the successive treatment of a series of wafers, one wafer being treated simultaneously in the treatment chamber. This apparatus may comprise one, two or more treatment chambers. The wafer handling apparatus may be of such design that a wafer can be taken by the wafer handling apparatus from a wafer storage box and be placed directly in a treatment chamber, without intermediate placement in a boat. Also, the whole treatment may consist in conducting a measurement at a wafer or in successively conducting several different measurements, carried out in several movably arranged sensor boxes.

Figure 10:
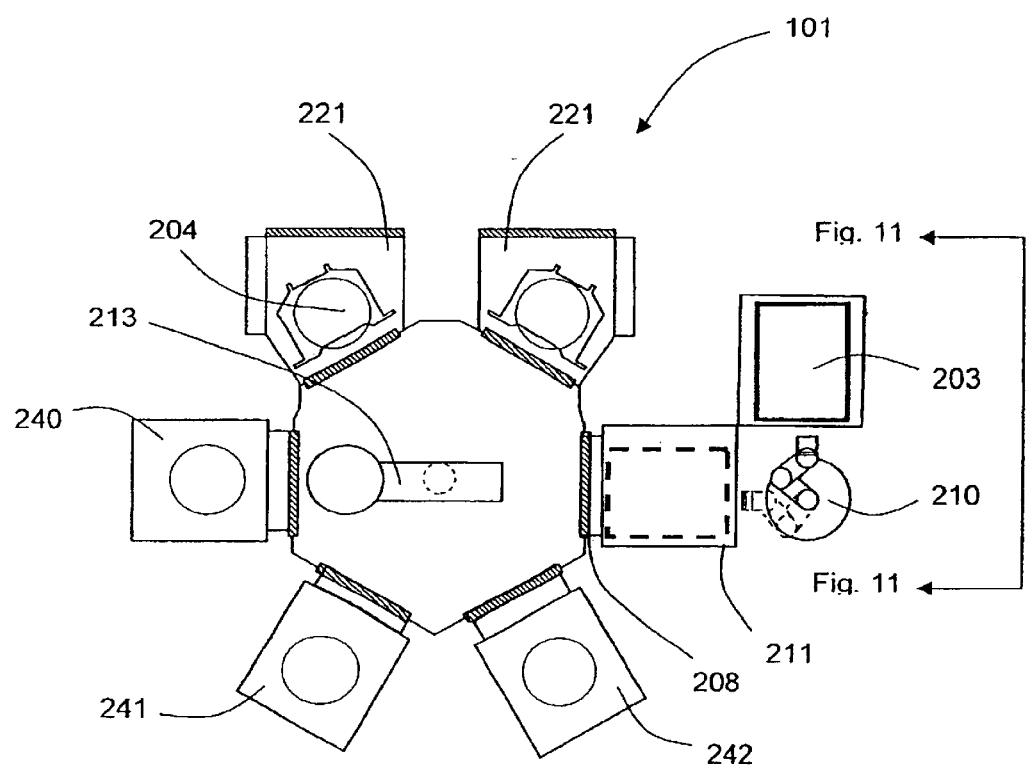
FIG. 10 is a top view of a fourth embodiment of the apparatus according to the invention.
Figure 11:
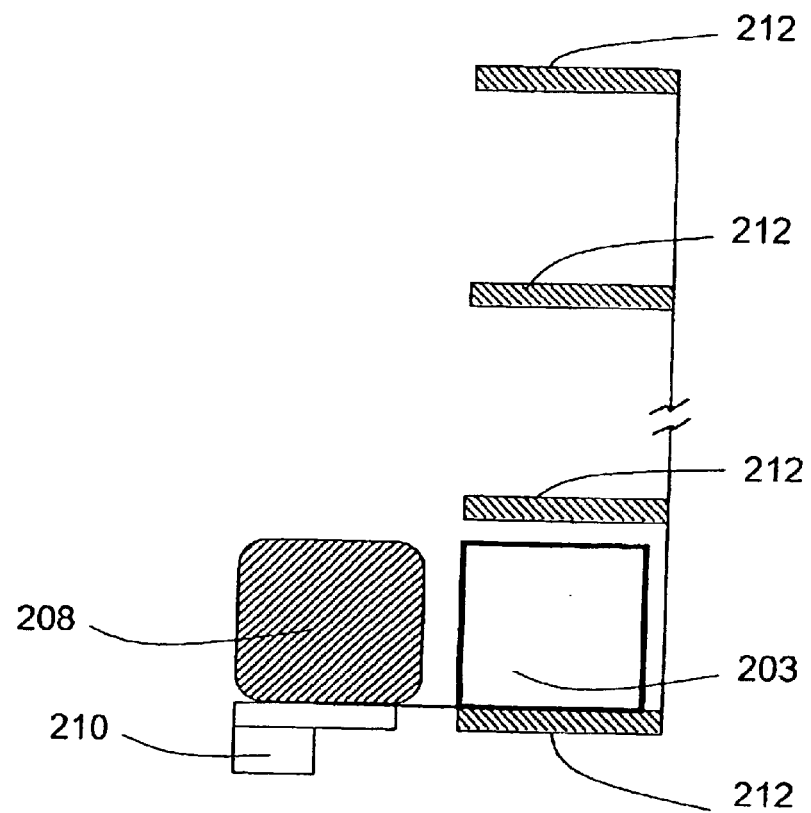
FIG. 11 is a view taken on the line XI—XI from FIG. 10.

FIGS. 10 and 11 show a last exemplary embodiment of an alternative apparatus according to the invention. Around the handling apparatus 113 are arranged three treatment chambers 240, 241, 242 and two loading chambers 221, in which a wafer storage cassette 204 can be placed. For wafers having a diameter of 200 mm or less an open cassette is the conventional container for wafers. For the purpose of conveying the wafers through the clean room the cassette is placed by an operator in a conveying box. The wafer handling apparatus 213 is located in an otherwise closed space, so that a desired pressure can be created therein. The wafers taken by the wafer handling apparatus 213 from the wafer storage cassettes 204 can be placed in the different treatment chambers 240, 241, 242. Furthermore, an inspection station 211 is available, on which a movable sensor box 203 can be placed by a sensor box handling apparatus 210. FIG. 11 is a view taken on the line XI—XI from FIG. 10, in which it is clear that the sensor box handling apparatus 210 can receive sensor boxes from different shelves 12 so as to place them before the inspection opening 208 provided with a door opener. Preferably, the sensor box 203 is provided with an interface and dimensions corresponding to the interface and the dimensions of a normal standardized wafer storage box (FOUP), so that a standard wafer storage box handling apparatus can be used for the sensor box handling apparatus 210. Also, a standard door opener 208 may be used to open the sensor box 203 when it is arranged on the inspection station 211. It is also possible that the sensor box is of vacuum-resistant design and is provided with a vacuum-resistant and vacuum-tight interface cooperating with a correspondingly designed door opener 208, so that the sensor box can operate at any desired low pressure.

As a result of the movably arranged sensor boxes, different measuring sensors may be used, as desired, in different apparatus available in a factory. Thus only a limited number of sensor boxes need to be bought for a factory and not a complete set of measuring sensors for each treatment apparatus for wafers. The resulting flexibility with respect to the number of measurements to be conducted is very favorable.

It is clear that the invention is not limited to the described exemplary embodiments, but that various modifications are possible within the framework of the invention.

Thus the concept of a movable sensor box may also be used successfully in an apparatus not provided with a treatment chamber for treating wafers in the classic sense of the word, i.e. for the application of a layer by means of e.g. a CVD process or for subjecting the wafer to a heat treatment. The treatment in the chain may also comprise a measuring treatment. According to the invention, the treatment chamber could therefore also be of movable design. In other words, the sensor box within the meaning of the present application may also form the treatment chamber. An apparatus in which this concept can be used is described in e.g. NL-C-1010317 and in particular in claim 3 thereof. The subject matter of NL-C-1010317 is to be considered inserted herein by reference. Such an apparatus would therefore comprise a sorting apparatus for wafers stored in wafer storage boxes or wafer cassettes, which sorting apparatus is provided with a feeding section for receiving at least two wafer storage boxes or wafer cassettes, the sorting apparatus being provided with a wafer handling apparatus for moving the wafers into and out of a wafer storage box or cassette from and to that other wafer storage box or cassette, the sorting apparatus also being provided with a storage system for wafer storage boxes and a wafer storage box handling apparatus, and the apparatus being provided with at least one sensor box arranged such that the wafer handling apparatus can feed a wafer into the at least one sensor box through an opening provided for that purpose in the at least one sensor box, and the at least one sensor box being arranged to carry out measurements at a wafer, the at least one sensor box being movably arranged, and the apparatus being provided with a sensor box handling apparatus arranged to move the at least one sensor box from a storage position to a measuring position. It is self-evident that the sensor box handling apparatus may be formed by the wafer storage box handling apparatus.

What is claimed is:

1. An apparatus for treating wafers, provided with at least one treatment chamber, the apparatus being provided with a feeding section in which wafers contained in a wafer storage box or wafer cassette can be fed into the apparatus, the apparatus being provided with a wafer handling apparatus, by means of which wafers can be taken out of the wafer storage boxes or wafer cassettes so as to be treated in the treatment chamber, and the apparatus being provided with at least one sensor box arranged such that the wafer handling apparatus can feed a wafer into the at least one sensor box through an opening provided for that purpose in the at least one sensor box, and the at least one sensor box being arranged to carry out measurements at a wafer, characterized in that the at least one sensor box is movably arranged and that the apparatus is provided with a sensor box handling apparatus arranged to move the at least one sensor box from a storage position to a measuring position.

2. An apparatus according to claim 1, wherein the apparatus is provided with at least one wafer storage box door opener, such as e.g. a wafer storage box door opener arranged to open a FOUP wafer storage box, and the sensor box is provided with a door arranged to cooperate with the wafer storage box door opener.

3. An apparatus according to claim 1, wherein the sensor box has such dimensions and the sensor box handling apparatus is provided with such an interface with the sensor box that this satisfies the standards for a FOUP wafer storage box and a FOUP wafer storage box handling apparatus, so that the sensor box handling apparatus can also being used to move FOUP wafer storage boxes.

4. An apparatus according to claim 1, wherein the apparatus also comprises a storage system for a number of wafer storage boxes, the sensor box being adapted for arrangement in the storage system.

5. An apparatus according to claim 1, wherein the apparatus is provided with a fixed storage position for the sensor box.

6. An apparatus according to claim 1, wherein the apparatus is provided with a second sensor box movably arranged between a storage position and measuring position.

7. An apparatus according to claim 1, wherein the wafer storage box is designed as a standardized FOUP box and the wafer storage box door opener is designed as a FOUP door opener.

8. An apparatus according to claim 1, wherein the movable sensor box is provided with a transmitter and a receiver for wirelessly transmitting and receiving signals, such as control signals and measuring data.

9. An apparatus according to claim 1, wherein the sensor box contains an ellipsometer.

10. An apparatus according to claim 1, wherein the sensor box contains a particle counter.

11. An apparatus according to claim 1, wherein the sensor box contains a wafer notch aligner.

12. An apparatus according to claim 1, wherein the sensor box contains a wafer ID reader.

13. An apparatus according to claim 1, wherein a fixedly arranged measuring station is included in the apparatus in such a position that the wafer handling apparatus can place wafers in and can take them out of the fixed measuring station.

14. An apparatus according to claim 13, wherein the fixed measuring station contains an ellipsometer, a wafer notch aligner and a wafer ID reader, and a stated movable sensor box contains a particle counter.

15. An apparatus according to claim 1, wherein the processing chambers are vertically arranged processing chambers loadable from a bottom side thereof with a boat of wafers.

16. An apparatus according to claim 1, wherein the apparatus is provided with at least two processing chambers and at least two boats, so that one boat can be unloaded and loaded in an unloading and loading position, while the other boat undergoes a treatment in a processing chamber, and the wafers of the boat that is in the unloading and loading position are movable to a stated sensor box with the wafer handling apparatus.

17. A sensor box, apparently intended for an apparatus according to claim 1.

18. A sensor box according to claim 17, wherein the sensor box is provided with an interface and dimensions making it suitable for cooperation with a door opener and a wafer storage box conveying and storage system arranged to cooperate with a standardized FOUP wafer storage box.

19. A sensor box according to claim 17, wherein the sensor box is provided with a transmitter and a receiver for wirelessly transmitting and receiving signals, such as control signals and measuring data.

20. An apparatus according to claim 2, wherein:

the sensor box has such dimensions and the sensor box handling apparatus is provided with such an interface with the sensor box that this satisfies the standards for a FOUP wafer storage box and a FOUP wafer storage box handling apparatus, so that the sensor box handling apparatus can also be used to move FOUP wafer storage boxes;

the apparatus also comprises a storage system for a number of wafer storage boxes, the sensor box being adapted for arrangement in the storage system;

the apparatus is provided with a fixed storage position for the sensor box;

the apparatus is provided with a second sensor box movably arranged between a storage position and a measuring position;

the wafer storage box is designed as a standardized FOUP box and the wafer storage box door opener is designed as a FOUP door opener;

the sensor box is provided with a transmitter and a receiver for wirelessly transmitting and receiving signals, such as control signals and measuring data;

the sensor box contains at least one of an ellipsometer, a particle counter, a wafer notch aligner, and a wafer ID reader;

a fixedly arranged measuring station is included in the apparatus in such a position that the wafer handling apparatus can place wafers in and can take them out of the fixed measuring station.

21. An apparatus according to claim 20, wherein the fixed measuring station contains an ellipsometer, a wafer notch aligner and a wafer ID reader, and a stated movable sensor box contains a particle counter.

22. A sensor box according to claim 18, wherein the sensor box is provided with a transmitter and a receiver for wirelessly transmitting and receiving signals, such as control signals and measuring data.

* * * * *

UNITED STATES PATENT AND TRADEMARK OFFICE
CERTIFICATE OF CORRECTION

PATENT NO. : 6,876,191 B2
APPLICATION NO. : 10/373645
DATED : April 5, 2005
INVENTOR(S) : Christianus Gerardus M. de Ridder et al.

It is certified that error appears in the above-identified patent and that said Letters Patent is hereby corrected as shown below:

Column 1, line 3, insert the following heading:
--BACKGROUND OF THE INVENTION--;

Column 1, line 19, "inter alia by applicant." should read --by applicant among others.--;

Column 1, line 43, "shows inter alia" should read --shows, among other things,--;

Column 1, line 54, "of the apparatus" should read --or floor surface area of the apparatus--;

Column 1, line 55, "or increased" should read --or is increased--;

Column 1, line 55, "less" should read --little--;

Column 1, line 59, "or be" should read --or should be--;

Column 1 line 59, "less" should read --little--;

Column 1, after line 61, insert the following heading:
--SUMMARY OF THE INVENTION--;

Column 1, line 66, "or be" should read --or should be--;

Column 1, line 66, "less" should read --little--;

Column 4, after line 18, insert the following heading:
--DESCRIPTION OF THE DRAWINGS--;

Column 6, line 1, "3" should read --4--;

Column 6, line 19, "system," should read --system 102,--;

Column 6, line 47, "apparatus according" should read --apparatus 101 according--;

Column 6, line 48, "113" should read --213--;

Column 6, line 64, "12" should read --212--; and

UNITED STATES PATENT AND TRADEMARK OFFICE
CERTIFICATE OF CORRECTION

PATENT NO. : 6,876,191 B2
APPLICATION NO. : 10/373645
DATED : April 5, 2005
INVENTOR(S) : Christianus Gerardus M. de Ridder et al.

It is certified that error appears in the above-identified patent and that said Letters Patent is hereby corrected as shown below:

Column 8, claim 3, line 19, "being" should read --be--.

Signed and Sealed this

Thirtieth Day of October, 2007

JON W. DUDAS
*Director of the United States Patent and Trademark Office*